United States Patent
Lee

(10) Patent No.: US 10,663,506 B2
(45) Date of Patent: May 26, 2020

(54) SYSTEM FOR DIAGNOSING FAULT OF RELAYS FOR VEHICLE

(71) Applicant: SK INNOVATION CO., LTD., Seoul (KR)

(72) Inventor: Jae Hee Lee, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 56 days.

(21) Appl. No.: 15/951,608

(22) Filed: Apr. 12, 2018

(65) Prior Publication Data

US 2018/0299500 A1    Oct. 18, 2018

(30) Foreign Application Priority Data

Apr. 13, 2017 (KR) .................. 10-2017-0047948

(51) Int. Cl.
| | |
|---|---|
| *G01R 31/00* | (2006.01) |
| *B60L 3/00* | (2019.01) |
| *G01R 31/327* | (2006.01) |
| *H02J 7/00* | (2006.01) |
| *B60L 3/04* | (2006.01) |
| *B60L 58/10* | (2019.01) |
| *B60L 3/12* | (2006.01) |

(52) U.S. Cl.
CPC .......... *G01R 31/005* (2013.01); *B60L 3/0069* (2013.01); *B60L 3/04* (2013.01); *B60L 3/12* (2013.01); *B60L 58/10* (2019.02); *G01R 31/3278* (2013.01); *H02J 7/0031* (2013.01); *B60L 2240/80* (2013.01); *B60L 2270/20* (2013.01); *Y02T 90/14* (2013.01)

(58) Field of Classification Search
CPC .................................................. G01R 31/005
See application file for complete search history.

(56) References Cited

U.S. PATENT DOCUMENTS

2006/0021098 A1 * 1/2006 Tezuka ................. H01H 47/002
                                                                 477/7
2015/0346282 A1 * 12/2015 Jeon ................... G01R 31/3278
                                                                324/418

FOREIGN PATENT DOCUMENTS

JP         2011-166950         8/2011

* cited by examiner

*Primary Examiner* — Jas A Sanghera
(74) *Attorney, Agent, or Firm* — IP & T Group LLP

(57) ABSTRACT

The present invention relates to a system for diagnosing a fault of relays for a vehicle. According to the exemplary embodiments of the present invention, it is possible to diagnose the fault of the relays for the vehicle with the simple device configuration.

12 Claims, 4 Drawing Sheets

[FIG. 3]

SYSTEM FOR DIAGNOSING FAULT OF RELAYS FOR VEHICLE

CROSS-REFERENCE TO RELATED APPLICATIONS

This application claims priority under 35 U.S.C. § 119 to Korean Patent Application No. 10-2017-0047948, filed on Apr. 13, 2017 in the Korean Intellectual Property Office. The disclosure of which is incorporated herein by reference in its entirety.

TECHNICAL FIELD

The following disclosure relates to a system for diagnosing a fault of relays for a vehicle.

BACKGROUND

Electric vehicles (HEV, PHEV, BEV, etc.) use electricity as main power or auxiliary power. For this purpose, a battery pack for a vehicle including a plurality of battery cells is mounted in the vehicle. Since the battery pack for the vehicle has a very high voltage, as disclosed in the following Patent Document 1, a positive electrode terminal of the battery pack for the vehicle is connected to a positive electrode contactor (or a positive electrode relay), a precharge circuit is connected to the positive electrode contactor in parallel, and a negative electrode terminal of the battery pack for the vehicle is connected to a negative electrode contactor (or a negative electrode relay), thereby securing stability of the vehicle.

However, the relays of the vehicle connected to the battery pack for the vehicle may be fused due to a high current supplied from the battery pack, and thus may fail to operate properly. When the relays for the vehicle are in a fused state or in an inoperative state as described above, the possibility of explosion of the battery pack and an electric shock of a driver becomes high, which may cause danger to both the vehicle and the driver.

Accordingly, the following Patent Document 1 discloses that the fusion of the contactors can be detected by detecting a change in a leakage current state by an on/off of a precharge relay with a leakage detection circuit.

RELATED ART DOCUMENT

Patent Document (Patent Document 1) Japanese Patent Laid-Open Publication No. 2011-166950 (Publication date: Aug. 25, 2011)

SUMMARY

An embodiment of the present invention is directed to providing a system capable of diagnosing a fault of relays for a vehicle with a simple device configuration.

Another embodiment of the present invention is directed to providing a system capable of diagnosing not only a fused state of relays for a vehicle but also an inoperative state of relays for a vehicle.

In one general aspect, a system for diagnosing a fault of relays including a first main relay having one end connected to a first electrode terminal of a battery pack and the other end connected to one end of a load, a second main relay having one end connected to a second electrode terminal of the battery pack and the other end connected to the other end of the load, and a precharge relay connected to the first main relay in parallel, the system includes: a first voltage measurement unit configured to measure a first voltage between the other end of the first main relay and one end of the second main relay; a second voltage measurement unit configured to measure a second voltage between the other end of the first main relay and the other end of the second main relay; a third voltage measurement unit configured to measure a third voltage between one end of the first main relay and the other end of the second main relay; a command unit configured to transmit the voltage measurement driving signal to the first voltage measurement unit, the second voltage measurement unit, or the third voltage measurement unit; a voltage sensing unit configured to sense the voltage measured by the first voltage measurement unit, the second voltage measurement unit, or the third voltage measurement unit in response to the voltage measurement driving signal; and a control unit configured to generate the voltage measurement driving signal and output the generated voltage measurement driving signal to the command unit, and receive the voltage sensed by the voltage sensing unit to diagnose whether the relays fail.

The system may further include: a switching unit configured to be connected to the second voltage measurement unit or the third voltage measurement unit, wherein the command unit includes a first command unit transmitting the voltage measurement driving signal to the first voltage measurement unit and a second command unit transmitting the voltage measurement driving signal to the second voltage measurement unit or the third voltage measurement unit and transmitting a switching unit driving signal generated by the control unit to the switching unit, and the voltage sensing unit includes a first voltage sensing unit sensing the voltage measured by the first voltage measurement unit and a second voltage sensing unit sensing the voltage measured by the second voltage measurement unit or the third voltage measurement unit according to an operation of the switching unit in response to the switching unit driving signal.

The system may further include: the first amplification unit configured to amplify the voltage sensed by the first voltage sensing unit and output the amplified voltage to the control unit; and a second amplification unit configured to amplify the voltage sensed by the second voltage sensing unit and output the amplified voltage to the control unit.

The control unit may receive the first voltage measured by the first voltage measurement unit while the first main relay, the second main relay, and the precharge relay are in an off state, and determine that the first main relay or the precharge relay is in a fused state when the first voltage is greater than or equal to a reference voltage.

The control unit may receive the third voltage measured by the third voltage measurement unit while the first main relay, the second main relay, and the precharge relay are in an off state, and determine that the second main relay is in a fused state when the third voltage is greater than or equal to a reference voltage.

The control unit may receive the third voltage measured by the third voltage measurement unit when the second main relay is switched to an on state while the first main relay, the second main relay, and the precharge relay are in an off state, and determine that the second main relay is in an inoperative state when the third voltage is smaller than a reference voltage.

The control unit may receive the second voltage measured by the second voltage measurement unit when the precharge relay is switched to an on state while the first main relay and the precharge relay are in an off state and the second main relay is in an on state, and determine that the precharge relay is in an inoperative state when the second voltage is smaller than a reference voltage.

The second voltage measurement unit may measure the second voltage after the precharge relay is switched to the on state and a predetermined time elapses.

The control unit may receive the second voltage measured by the second voltage measurement unit when the first main relay is switched to an on state and the precharge relay is switched to an off state while the first main relay is in an off state and the second main relay and the precharge relay are in an on state, and determine that the first main relay is in an inoperative state when the second voltage is smaller than a reference voltage.

The control unit may receive a second voltage measured by the second voltage measurement unit when the second main relay is switched to an off state while the first main relay and the second main relay are in an on state and the precharge relay is in an off state, and determine that the second main relay is in a fused state when the second voltage is greater than or equal to a reference voltage.

The control unit may receive a first voltage measured by the first voltage measurement unit when the first main relay is switched to an off state while the first main relay is in an on state and the second main relay and the precharge relay are in an off state, and determine that the first main relay or the precharge relay is in a fused state when the first voltage is greater than or equal to a reference voltage.

The control unit may receive a third voltage measured by the third voltage measurement unit when the first main relay and the second main relay are switched to an off state while the first main relay and the second main relay are in an on state and the precharge relay is in an off state, and determine that the second main relay is in a fused state when the third voltage is greater than or equal to a reference voltage.

Other features and aspects will be apparent from the following detailed description, the drawings, and the claims.

DETAILED DESCRIPTION OF EMBODIMENTS

Hereinafter, the present invention will be described in detail with reference to the accompanying drawings. A detailed description for well-known functions and configurations that may obscure the gist of the present invention will be omitted.

Figure 1:
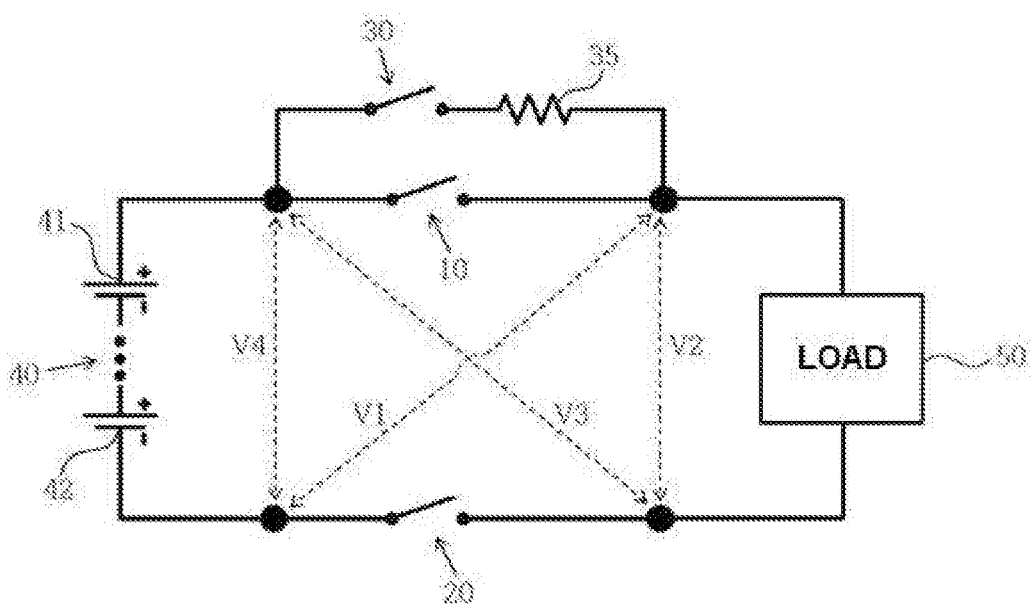
FIG. 1 is a view showing an aspect of a voltage measured by a voltage measurer.

FIG. 1 is a diagram showing an aspect of a voltage measured by a voltage measurement unit. Referring to FIG. 1, a battery pack 40 for a vehicle is connected to a load 50 via relays for a vehicle.

The battery pack 40 for the vehicle includes a plurality of battery cells, and has first and second electrode terminals 41 and 42 provided at both ends thereof. Although the first electrode terminal 41 and the second electrode terminal 42 each are shown as a positive electrode terminal and a negative electrode terminal in FIG. 1, the first electrode terminal 41 and the second electrode terminal 42 may each be a negative electrode terminal and a positive electrode terminal.

The load 50 may be an inverter, and the inverter serves to convert direct power from the battery pack 40 for the vehicle into alternating power and supply the alternating power to a motor for the vehicle (not shown).

In the present invention, the relays for the vehicle may include a first main relay 10, a second main relay 20, and a precharge relay 30.

One end of the first main relay 10 is connected to the first electrode terminal 41 of the battery pack 40 for a vehicle and the other end is connected to one end of the load 50.

One end of the second main relay 20 is connected to the second electrode terminal 42 of the battery pack 40 for the vehicle and the other end thereof is connected to the other end of the load 50.

When the first main relay 10 is a positive main relay, the second main relay 20 may be a negative main relay, and when the first main relay 10 is a negative main relay, the second main relay 20 may be a positive main relay.

The precharge relay 30 is connected to the precharge resistor 35 in series and the precharge relay 30 and a precharge resistor 35 are connected to the first main relay 10 in parallel. The precharge relay 30 and the precharge resistor 35 precharge the current before the current output from the battery pack 40 flows through the first main relay 10, and thus serve to prevent an arc discharge which may occur at the main relays 10 and 20 and prevent a fusion which may occur at the main relays 10 and 20 due to an inrush current.

Meanwhile, In the present invention, the voltage measurement unit 100 measures the voltage between a first electrode line (i.e., the electrode line where the first main relay 10 is located) and a second electrode line (i.e., the electrode line where the second main relay 20 is located), and a control unit 600 diagnoses whether the relays for the vehicle fail using the measured voltage.

Figure 2:
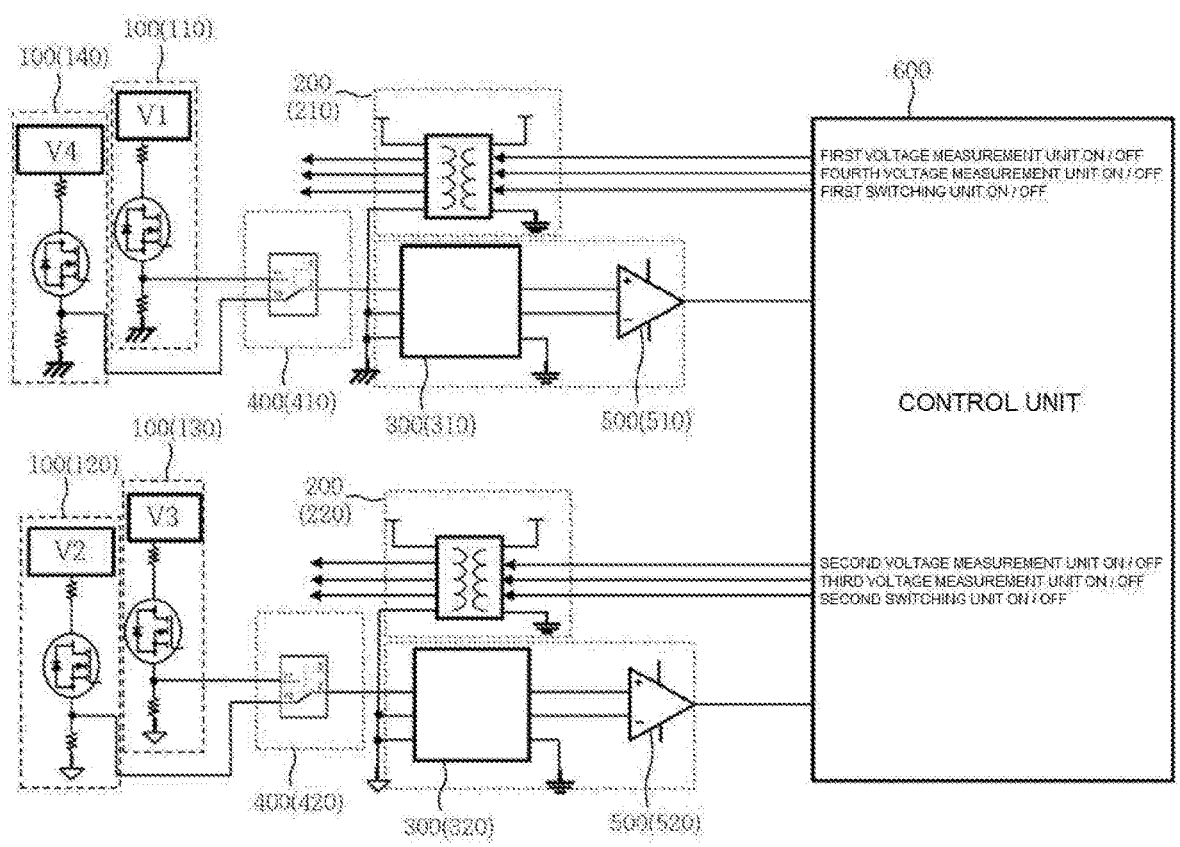
FIG. 2 is a diagram illustrating a system for diagnosing a fault of relays for a vehicle according to an exemplary embodiment of the present invention.

FIG. 2 illustrates a system for diagnosing a fault of relays for a vehicle according to an exemplary embodiment of the present invention. Hereinafter, referring to FIG. 2, a system for diagnosing a fault of relays for a vehicle according to the exemplary embodiment of the present invention will be described in detail.

The system for diagnosing a fault of relays for a vehicle according to the exemplary embodiment of the present invention may be configured to include a voltage measurement unit 100, a command unit 200, a voltage sensing unit 300, and a control unit 600.

The voltage measurement unit 100 includes a first voltage measurement unit 110, a second voltage measurement unit 120 and a third voltage measurement unit 130 and may further include a fourth voltage measurement unit 140.

Each voltage measurement unit 100 may be configured to include a MOSFET and a resistance distribution circuit as shown in FIG. 2. A driving signal (specifically, the voltage measurement driving signal) generated by the control unit 600 is applied to gates of the MOSFETs configuring the voltage measurement unit 100, such that each voltage measurement unit 100 may measure the voltage between the first electrode line and the second electrode line.

The first voltage measurement unit 110 measures a first voltage V1 between the other end of the first main relay 10 and one end of the second main relay 20 by setting one end of the second main relay 20 as a ground (i.e., setting a connection node between the second electrode terminal 42 and the second main relay 20 as the ground).

The second voltage measurement unit 120 measures a second voltage V2 between the other end of the first main relay 10 and the other end of the second main relay 20 by setting the other end of the second main relay 20 as a ground (i.e., setting a connection node between the load 50 and the second main relay 20 as the ground).

The third voltage measurement unit 130 measures a third voltage V3 between one end of the first main relay 10 and the other end of the second main relay 20 by setting the other end of the second main relay 20 as the ground.

The fourth voltage measurement unit 140 measures a fourth voltage V4 between one end of the first main relay 10 and one end of the second main relay 20 by setting one end of the second main relay 20 as the ground. That is, the fourth voltage measurement unit 140 is a component to measure the voltage of the battery pack 40. In the diagnosis of the fault of the relays for the vehicle, the fourth voltage measurement unit 140 may serve to provide a reference voltage (that is, the reference voltage may be the voltage of the battery pack 40 or a value obtained by multiplying the voltage of the battery pack 40 by a predetermined constant). The voltage of the battery pack 40 may be different before, during, and after running of the vehicle. Accordingly, when the reference voltage is set using the fourth voltage V4 measured by the fourth voltage measurement unit 140, it is possible to diagnose whether the relays for the vehicle fail depending on the voltage of the battery pack 40 which varies depending on the running state of the vehicle, such that the accuracy of the diagnosis can be increased.

The command unit 200 receives the driving signal generated by the control unit 600 and transmits the driving signal to the voltage measurement unit 100. As the driving signal that the command unit 200 receives from the control unit 600 may include a voltage measurement driving signal for turning on/off the voltage measurement unit 100, and a switching unit driving signal for operating the switching unit 400 as described below.

For example, when the command unit 200 receives a voltage measurement driving signal for turning on the voltage measurement unit 100 from the control unit 600, the command unit 200 applies a voltage of 5V to the voltage measurement unit 100 to allow the voltage measurement unit 100 to measure the voltage between the first electrode line and the second electrode line. In contrast, when the command unit 200 receives the driving signal for turning off the voltage measurement unit 100 from the control unit 600, the command unit 200 applies a voltage of 0V to the voltage measurement unit 100 to allow the voltage measurement unit 100 to stop measuring the voltage between the first electrode line and the second electrode line.

When the command unit 200 transmits the voltage measurement driving signal generated in the control unit 600 to the voltage measurement unit 100, it is required that the command unit 200 is made of an insulated element in order to ensure safety of the vehicle or the driver. Accordingly, the command unit 200 may be configured of a photocoupler or an isolated switch or may be configured to include the same.

The command unit 200 may have a first command unit 210 and a second command unit 220.

The first command unit 210 receives the voltage measurement driving signal generated by the control unit 600 and then transmits the received voltage measurement driving signal to the first voltage measurement unit 110 or the fourth voltage measurement unit 140, and the second command unit 220 receives the voltage measurement driving signal generated by the control unit 600 and then transmits the received voltage measurement driving signal to the second voltage measurement unit 120 or the third voltage measurement unit 130.

The reason why the first command unit 210 is configured to transmit the voltage measurement driving signal to the first voltage measurement unit 110 or the fourth voltage measurement unit 140 is that the first voltage measurement unit 110 and the fourth voltage measurement unit 140 set the connection node between the second electrode terminal 42 and the second main relay 20 as a common ground. The reason why the second command unit 220 is configured to transmit the voltage measurement driving signal to the second voltage measurement unit 120 or the third voltage measurement unit 130 is that the second voltage measurement unit 120 and the third voltage measurement unit 130 set the connection node between the load 50 and the second main relay 20 as the common ground.

The voltage sensing unit 300 serves to sense the voltage measured by the voltage measurement unit 100 and may include a first voltage sensing unit 310 and a second voltage sensing unit 320.

When the voltage sensing unit 300 senses the voltage measured by the voltage measurement unit 100, it is required that the voltage sensing unit 300 is made of an insulated element to ensure safety of a vehicle or a driver. Therefore, the voltage sensing unit 300 is configured as an isolated voltage sensor or may be configured to include the same.

The first voltage sensing unit 310 may sense the voltage measured by the first voltage measurement unit 110 or the fourth voltage measurement unit 140 in response to the voltage measurement driving signal generated by the control unit 600. In addition, the second voltage sensing unit 320 may sense the voltage measured by the second voltage measurement unit 120 or the third voltage measurement unit 130 in response to the voltage measurement driving signal generated by the control unit 600.

Meanwhile, the system according to the exemplary embodiment of the present invention senses the voltage measured by the voltage measurement unit 100 and may further include the switching unit 400 to reduce the number of elements configuring the system. The switching unit 400 may be configured of, for example, a multiplexer switch and serves to connect between the voltage measurement unit 100 and the voltage sensing unit 300.

The switching unit 400 may include a first switching unit 410 and a second switching unit 420.

The first switching unit 410 is connected to the first voltage measurement unit 110 or the fourth voltage measurement unit 140 and is operated to connect the first voltage sensing unit 310 to the first voltage measurement unit 110 or the first voltage sensing unit 310 to the fourth voltage measurement unit 140 in response to the switching unit driving signal generated by the control unit 600.

The first voltage sensing unit 310 may sense the first voltage V1 when the first switching unit 410 is connected to the first voltage measurement unit 110, and sense the fourth voltage V4 when the first switching unit 410 is connected to the fourth voltage measurement unit 140. However, since the fourth voltage measurement unit 140 is configured to measure the voltage of the battery pack 40, the fourth voltage measurement unit 140 may not be used when the fault of the relays for the vehicle is diagnosed. In this case, the first voltage sensing unit 310 is directly connected to the first voltage measurement unit 110 and senses only the first voltage V1 measured by the first voltage measurement unit 110.

The second switching unit 420 is connected to the second voltage measurement unit 120 or the third voltage measurement unit 130 and is operated to connect the second voltage sensing unit 320 to the second voltage measurement unit 120 or the second voltage sensing unit 320 to the third voltage measurement unit 130 in response to the switching unit driving signal generated by the control unit 600.

The second voltage sensing unit 320 may sense the second voltage V2 when the second switching unit 420 is connected to the second voltage measurement unit 120, and sense the third voltage V3 when the second switching unit 420 is connected to the third voltage measurement unit 130.

As described above, since the switching unit 400 is provided for connecting between the voltage measurement unit 100 and the voltage sensing unit 300, the command unit 200 and the voltage sensing unit 300 are not separately provided for each voltage measurement unit 100, it is possible to reduce the number of elements configuring the system, thereby reducing the size of the entire system and the cost of implementing the system.

On the other hand, the voltage that the voltage sensing unit 300 receives from the voltage measurement unit 100 may have a form of a weak analog signal of generally 0 or more and 2 V or less. Accordingly, an amplification unit 500 which amplifies the voltage sensed by the voltage sensing unit 300 and outputs the amplified voltage to the control unit 600 is preferably provided.

The amplification unit 500 may include a first amplification unit 510 and a second amplification unit 520. The first amplification unit 510 amplifies the voltage sensed by the first voltage sensing unit 310 and outputs the amplified voltage to the control unit 600, and the second amplification unit 520 amplifies the voltage sensed by the second voltage sensing unit 320 and outputs the amplified voltage to the control unit 600.

As described above, the control unit 600 generates a driving signal and outputs the driving signal to the command unit 200. Here, the driving signal includes a voltage measurement driving signal for turning on/off the voltage measurement unit 100 and the switching unit driving signal for operating the switching unit 400.

The voltage measurement unit 100 measures the voltage between the first electrode line and the second electrode line in response to the voltage measurement driving signal. The switching unit 400 is operated in response to the switching unit driving signal to connect the voltage measurement unit 100 to the voltage sensing unit 300.

In addition, the control unit 600 serves to receive the voltage sensed by the voltage sensing unit 300 and diagnose whether the relays for the vehicle fail. Here, diagnosing the fault of the relays for the vehicle by the control unit 600 means determining the fused state of the relays for the vehicle or the inoperative state of the relays for the vehicle.

Hereinafter, a process for the control unit 600 to diagnose whether or not the relays for the vehicle fail will be described with reference to FIGS. 3 and 4.

Figure 3:
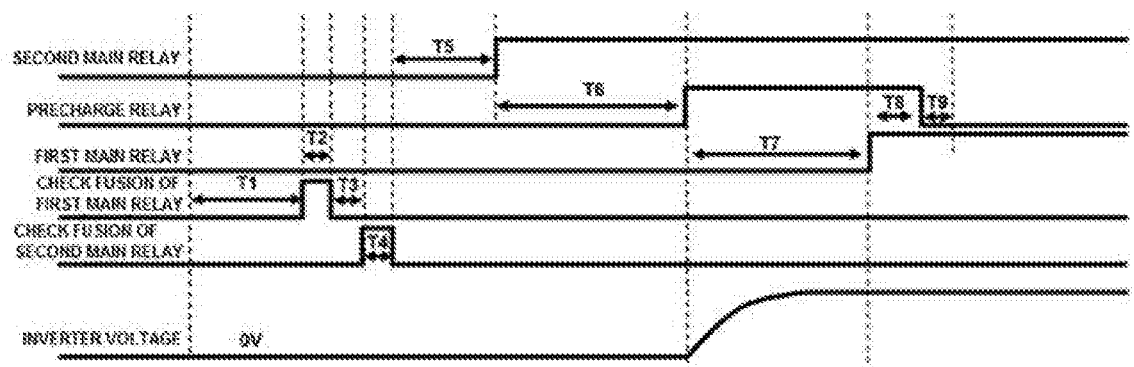
FIG. 3 is a view showing an operation sequence of relays for a vehicle before and during running of a vehicle.
Figure 4:
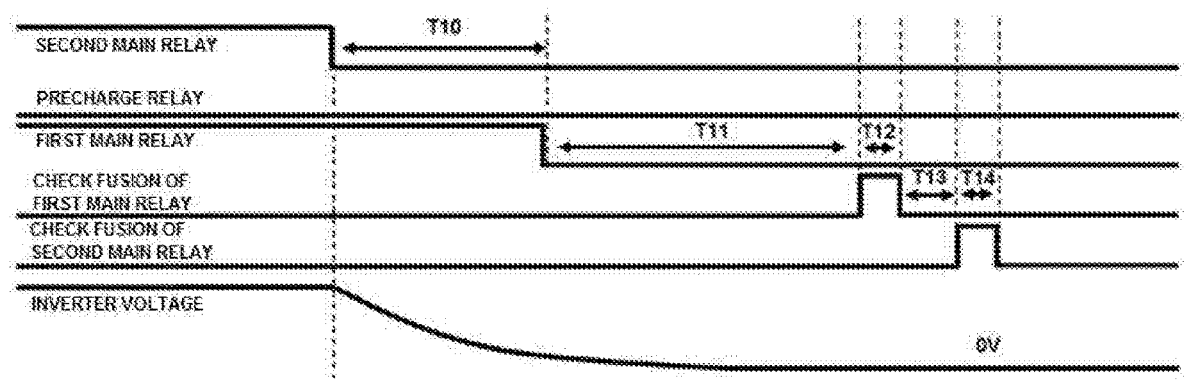
FIG. 4 is a view showing an operation sequence of the relays for the vehicle after and during running of the vehicle.

FIG. 3 is a diagram showing an operation sequence of relays for a vehicle before and during running of the vehicle, and FIG. 4 is a diagram showing an operation sequence of the relays for the vehicle during and after running of the vehicle. On the other hand, the operation of the relays for the vehicle can be controlled by a relay driver which is one of the components of the battery management system (BMS).

First, in a time interval T1, the first main relay 10, the second main relay 20, and the precharge relay 30 are all in an off state.

In the time interval T1, the first switching unit 410 may be connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, $VT1=0.9 \times V4$). Meanwhile, the second switching unit 420 may be connected to the second voltage measurement unit 120.

In a time interval T2, it may be determined whether the first main relay 10 or the precharge relay 30 are fused.

Specifically, the control unit 600 generates the driving signal (i.e., a voltage measurement driving signal) for operating the first voltage measurement unit 110 and outputs the generated driving signal to the first command unit 210, and generates the driving signal (i.e., switching unit driving signal) for connecting between the first voltage measurement unit 110 and the first voltage sensing unit 310 and outputs the generated driving signal to the first command unit 210. The first command unit 210 transmits the voltage measurement driving signal to the first voltage measurement unit 110, such that the first voltage measurement unit 110 sets one end of the second main relay 20 as a ground to measure the first voltage V1 between the other end of the first main relay 10 and one end of the second main relay 20. In addition, the first command unit 210 transmits the switching unit driving signal to the first switching unit 410, such that the first voltage sensing unit 310 senses the first voltage V1 measured by the first voltage measurement unit 110.

The control unit 600 receives the first voltage V1 sensed by the first voltage sensing unit 310 to determine whether the first main relay 10 or the precharge relay 30 is fused. More specifically, the control unit 600 receives the first voltage V1 measured by the first voltage measurement unit 110 from the first voltage sensing unit 310 and may determine that the first main relay 10 or the precharge relay 30 is in the fused state when the first voltage V1 is greater than or equal to the reference voltage VT1.

In a time interval T3, the system is in a standby state. In this case, the first main relay 10, the second main relay 20, and the precharge relay 30 are still kept in an off state.

Like the time interval T1, in the time interval T3, the first switching unit 410 may be connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, $VT2=0.9 \times V4$). Meanwhile, the second switching unit 420 may be continuously connected to the second voltage measurement unit 120.

In a time interval T4, it may be determined whether the second main relay 20 may be fused.

Specifically, the control unit 600 generates the voltage measurement driving signal for operating the third voltage measurement unit 130 and outputs the generated voltage measurement driving signal to the second command unit 220, and generates the switching unit driving signal for connecting between the third voltage measurement unit 130 and the second voltage sensing unit 320 and outputs the generated switching unit driving signal to the second command unit 220. The second command unit 220 transmits the voltage measurement driving signal to the third voltage measurement unit 130, such that the third voltage measurement unit 130 sets the other end of the second main relay 20 as the ground to measure the third voltage V3 between one end of the first main relay 10 and the other end of the second main relay 20. In addition, the second command unit 220 transmits the switching unit driving signal to the second switching unit 420, such that the second voltage sensing unit 320 senses the third voltage V3 measured by the third voltage measurement unit 130.

The control unit 600 receives the third voltage V3 sensed by the second voltage sensing unit 320 to determine whether the second main relay 20 is fused. More specifically, the control unit 600 receives the third voltage V3 measured by the third voltage measurement unit 130 through the second voltage sensing unit 320 and may determine that the second main relay 20 is in the fused state when the third voltage V3 is greater than or equal to the reference voltage VT2.

In a time interval T5, the system is in a standby state again. In this case, the first main relay 10, the second main relay 20, and the precharge relay 30 are still kept in an off state. In a time interval T5, the first switching unit 410 may be continuously connected to the fourth voltage measurement unit 140, and the second switching unit 420 may be connected to the second voltage measurement unit 120 again.

In a time interval T6, the first main relay 10 and the precharge relay 30 are still kept in the off state, and only the second main relay 20 is switched from the off state to the on state. In the time interval T6, it may be determined whether the second main relay 20 is in an inoperative state (i.e., whether or not the second main relay 20 is properly switched from the off state to the on state).

In the time interval T6, the first switching unit 410 may be continuously connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, VT3=0.9×V4).

The control unit 600 generates the voltage measurement driving signal for operating the third voltage measurement unit 130 and outputs the generated voltage measurement driving signal to the second command unit 220, and generates the switching unit driving signal for connecting between the third voltage measurement unit 130 and the second voltage sensing unit 320 and outputs the generated switching unit driving signal to the second command unit 220. The second command unit 220 transmits the voltage measurement driving signal to the third voltage measurement unit 130, such that the third voltage measurement unit 130 sets the other end of the second main relay 20 as the ground to measure the third voltage V3 between one end of the first main relay 10 and the other end of the second main relay 20. In addition, the second command unit 220 transmits the switching unit driving signal to the second switching unit 420, such that the second voltage sensing unit 320 senses the third voltage V3 measured by the third voltage measurement unit 130.

The control unit 600 receives the third voltage V3 sensed by the second voltage sensing unit 320 to determine whether the second main relay 20 is inoperative. More specifically, the control unit 600 receives the third voltage V3 measured by the third voltage measurement unit 130 from the second voltage sensing unit 320 and may determine that the second main relay 20 is in the inoperative state when the third voltage V3 is smaller than the reference voltage VT3.

In a time interval T7, the first main relay 10 is kept in the off state, the second main relay 20 is kept in the on state, and the precharge relay 30 is switched from the off state to the on state. In the time interval T7, it may be determined whether the precharge relay 30 is in the inoperative state (i.e., whether or not the precharge relay 30 is properly switched from the off state to the on state). In the time interval T7, the first switching unit 410 may be continuously connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, VT4=0.9×V4).

The control unit 600 generates the voltage measurement driving signal for operating the second voltage measurement unit 120 and outputs the generated voltage measurement driving signal to the second command unit 220, and generates the switching unit driving signal for connecting between the second voltage measurement unit 130 and the second voltage sensing unit 320 and outputs the generated switching unit driving signal to the second command unit 220.

The second command unit 220 transmits the voltage measurement driving signal to the second voltage measurement unit 120, such that the second voltage measurement unit 120 sets the other end of the second main relay 20 as the ground to measure the second voltage V2 between the other end of the first main relay 10 and the other end of the second main relay 20. In order for the second voltage measurement unit 120 to measure the second voltage (i.e., load voltage) having a certain stable value, the precharge relay 30 is switched to an on state, and may measure the second voltage V2 after a predetermined time has elapsed. Here, the predetermined time may mean a time required for a capacitor (not shown) connected to both ends of the load to be charged to a predetermined level or higher by a current flowing through the precharge relay 30. More specifically, the predetermined time may be about 2.33×R (precharge resistance value)×C (capacitance of the capacitor connected to the load).

In addition, the second command unit 220 transmits the switching unit driving signal to the second switching unit 420, such that the second voltage sensing unit 320 senses the second voltage V2 measured by the second voltage measurement unit 120.

The control unit 600 receives the second voltage V2 sensed by the second voltage sensing unit 320 to determine whether the precharge relay 20 is inoperative. More specifically, the control unit 600 receives the second voltage V2 measured by the second voltage measurement unit 120 through the second voltage sensing unit 320 and may determine that the precharge relay 30 is in the inoperative state when the second voltage V2 is smaller than the reference voltage VT4.

In a time interval T8, the second main relay 10 and the precharge relay 30 are still kept in the on state, and only the first main relay 10 is switched from the off state to the on state. In a time interval T8, the first switching unit 410 may be continuously connected to the fourth voltage measurement unit 140, and the second switching unit 420 may be continuously connected to the second voltage measurement unit 120.

A time interval T9 indicates the operation of the relays for the vehicle during running of the vehicle. In a time interval T9, the first main relay 10 and the second main relay 20 are still kept in the on state, and the precharge relay 30 is switched from the on state to the off state. In the time interval T9, it may be determined whether the first main relay 10 is in an inoperative state (i.e., whether or not the first main relay 10 is properly switched from the off state to the on state).

In the time interval T9, the first switching unit 410 may be continuously connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, VT5=0.9×V4).

Meanwhile, the control unit 600 generates the voltage measurement driving signal for operating the second voltage measurement unit 120 and outputs the generated voltage measurement driving signal to the second command unit 220, and generates the switching unit driving signal for connecting between the second voltage measurement unit 130 and the second voltage sensing unit 320 and outputs the generated switching unit driving signal to the second command unit 220. However, since the second switching unit 420 is already connected to the second voltage measurement unit 120 to measure the second voltage V2 in the time interval T8, in the time interval T9, the control unit 600 may not generate the driving signal.

The control unit 600 receives the second voltage V2 sensed by the second voltage sensing unit 320 to determine whether the first main relay 10 is inoperative. More specifically, the control unit 600 receives the second voltage V2 measured by the second voltage measurement unit 120 through the second voltage sensing unit 320 and may determine that the first main relay 10 is in the inoperative state when the second voltage V2 is smaller than the reference voltage VT5.

A time interval T10 indicates the operation of the relays for the vehicle when the vehicle is started off (or key off). In a time interval T10, the first main relay 10 is kept in the on state, the precharge relay 30 is kept in the off state, and the second main relay 20 is switched from the on state to the off state. In a time interval T10, it may be determined whether the second main relay 20 is fused.

In the time interval T10, the first switching unit 410 may be continuously connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, VT6=0.9×V4).

Meanwhile, the control unit 600 generates the voltage measurement driving signal for operating the second voltage measurement unit 120 and outputs the generated voltage measurement driving signal to the second command unit 220, and generates the switching unit driving signal for connecting between the second voltage measurement unit 130 and the second voltage sensing unit 320 and outputs the generated switching unit driving signal to the second command unit 220. However, since the second switching unit 420 is already connected to the second voltage measurement unit 120 to measure the second voltage V2 in the time interval T9, in the time interval T10, the control unit 600 may not generate the driving signal.

The control unit 600 receives the second voltage V2 sensed by the second voltage sensing unit 320 to determine whether the second main relay 20 is fused. More specifically, the control unit 600 receives the second voltage V2 measured by the second voltage measurement unit 120 through the second voltage sensing unit 320 and may determine that the second main relay 20 is in the fused state when the second voltage V2 is greater than or equal to the reference voltage VT6.

A time interval T11 also indicates the operation of the relays for the vehicle when the vehicle is started off (or key off). In a time interval T11, the second main relay 20 and the precharge relay 30 are still kept in the off state, and only the first main relay 10 is switched from the on state to the off state. In the time interval T11, the first switching unit 410 may be continuously connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, VT7=0.9×V4). Meanwhile, the second switching unit 420 may be continuously connected to the second voltage measurement unit 120.

In a time interval T12, it may be determined whether the first main relay 10 or the precharge relay 30 are fused.

Specifically, the control unit 600 generates the voltage measurement driving signal for operating the first voltage measurement unit 110 and outputs the generated voltage measurement driving signal to the first command unit 210, and generates the switching unit driving signal for connecting between the first voltage measurement unit 110 and the first voltage sensing unit 310 and outputs the generated switching unit driving signal to the first command unit 210. The first command unit 210 transmits the voltage measurement driving signal to the first voltage measurement unit 110, such that the first voltage measurement unit 110 sets one end of the second main relay 20 as a ground to measure the first voltage V1 between the other end of the first main relay 10 and one end of the second main relay 20. In addition, the first command unit 210 transmits the switching unit driving signal to the second switching unit 410, such that the first voltage sensing unit 310 senses the first voltage V1 measured by the first voltage measurement unit 110.

The control unit 600 receives the first voltage V1 sensed by the first voltage sensing unit 310 to determine whether the first main relay 10 or the precharge relay 30 is fused. More specifically, the control unit 600 receives the first voltage V1 measured by the first voltage measurement unit 110 through the first voltage sensing unit 310 and may determine that the first main relay 10 or the precharge relay 30 is in the fused state when the first voltage V1 is greater than or equal to the reference voltage VT7.

In a time interval T13, the system is in a standby state. In this case, the first main relay 10, the second main relay 20, and the precharge relay 30 are still kept in an off state.

Like the time interval T12, in the time interval T13, the first switching unit 410 may be connected to the fourth voltage measurement unit 140 to allow the first voltage sensing unit 310 to sense the fourth voltage V4, such that the control unit 600 may set a value obtained by multiplying the fourth voltage V4 by a predetermined constant (for example, 0.9) as a reference voltage (for example, VT8=0.9×V4). Meanwhile, the second switching unit 420 may be continuously connected to the second voltage measurement unit 120.

In a time interval T14, it may be determined whether the second main relay 20 is fused.

Specifically, the control unit 600 generates the voltage measurement driving signal for operating the third voltage measurement unit 130 and outputs the generated voltage measurement driving signal to the second command unit 220, and generates the switching unit driving signal for connecting between the third voltage measurement unit 130 and the second voltage sensing unit 320 and outputs the generated switching unit driving signal to the second command unit 220. The second command unit 220 transmits the voltage measurement driving signal to the third voltage measurement unit 130, such that the third voltage measurement unit 130 sets the other end of the second main relay 20 as the ground to measure the third voltage V3 between one end of the first main relay 10 and the other end of the second main relay 20. In addition, the second command unit 220 transmits the switching unit driving signal to the second switching unit 420, such that the second voltage sensing unit 320 senses the third voltage V3 measured by the third voltage measurement unit 130.

The control unit 600 receives the third voltage V3 sensed by the second voltage sensing unit 320 to determine whether the second main relay 20 is fused. More specifically, the control unit 600 receives the third voltage V3 measured by the third voltage measurement unit 130 through the second voltage sensing unit 320 and may determine that the second main relay 20 is in the fused state when the third voltage V3 is greater than the reference voltage VT8.

According to the exemplary embodiments of the present invention, it is possible to diagnose the fault of the relays for the vehicle with the simple device configuration.

Further, according to the exemplary embodiment of the present invention, it is possible to determine not only the fused state of the relays for the vehicle but also the inoperative state of the relays for the vehicle.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the scope and spirit of the present invention should be understood only by the following claims, and all of the equivalences and equivalent modifications to the claims are intended to fall within the scope and spirit of the present invention.

What is claimed is:

1. A system for diagnosing a fault of relays including a first main relay having one end connected to a first electrode terminal of a battery pack and the other end connected to one end of a load, a second main relay having one end connected to a second electrode terminal of the battery pack and the other end connected to the other end of the load, and a precharge relay connected to the first main relay in parallel, the system comprising:
a first voltage measurement unit configured to measure a first voltage between the other end of the first main relay and one end of the second main relay;
a second voltage measurement unit configured to measure a second voltage between the other end of the first main relay and the other end of the second main relay;
a third voltage measurement unit configured to measure a third voltage between one end of the first main relay and the other end of the second main relay;
a command unit configured to transmit a voltage measurement driving signal to the first voltage measurement unit, the second voltage measurement unit, or the third voltage measurement unit;
a voltage sensing unit configured to sense a voltage measured by the first voltage measurement unit, the second voltage measurement unit, or the third voltage measurement unit in response to the voltage measurement driving signal; and
a control unit configured to generate the voltage measurement driving signal and output the generated voltage measurement driving signal to the command unit, and receive the voltage sensed by the voltage sensing unit to diagnose whether the relays fail.

2. The system of claim 1, further comprising:
a switching unit configured to be connected to the second voltage measurement unit or the third voltage measurement unit,
wherein the command unit includes a first command unit transmitting the voltage measurement driving signal to the first voltage measurement unit and a second command unit transmitting the voltage measurement driving signal to the second voltage measurement unit or the third voltage measurement unit and transmitting a switching unit driving signal generated by the control unit to the switching unit, and
the voltage sensing unit includes a first voltage sensing unit sensing the voltage measured by the first voltage measurement unit and a second voltage sensing unit sensing the voltage measured by the second voltage measurement unit or the third voltage measurement unit according to an operation of the switching unit in response to the switching unit driving signal.

3. The system of claim 2, further comprising:
a first amplification unit configured to amplify the voltage sensed by the first voltage sensing unit and output the amplified voltage to the control unit; and
a second amplification unit configured to amplify the voltage sensed by the second voltage sensing unit and output the amplified voltage to the control unit.

4. The system of claim 1, wherein the control unit receives the first voltage measured by the first voltage measurement unit while the first main relay, the second main relay, and the precharge relay are in an off state, and determines that the first main relay or the precharge relay is in a fused state when the first voltage is greater than or equal to a reference voltage.

5. The system of claim 1, wherein the control unit receives the third voltage measured by the third voltage measurement unit while the first main relay, the second main relay, and the precharge relay are in an off state, and determines that the second main relay is in a fused state when the third voltage is greater than or equal to a reference voltage.

6. The system of claim 1, wherein the control unit receives the third voltage measured by the third voltage measurement unit when the second main relay is switched to an on state while the first main relay, the second main relay, and the precharge relay are in an off state, and determines that the second main relay is in an inoperative state when the third voltage is smaller than a reference voltage.

7. The system of claim 1, wherein the control unit receives the second voltage measured by the second voltage measurement unit when the precharge relay is switched to an on state while the first main relay and the precharge relay are in an off state and the second main relay is in an on state, and determines that the precharge relay is in an inoperative state when the second voltage is smaller than a reference voltage.

8. The system of claim 7, wherein the second voltage measurement unit measures the second voltage after the precharge relay is switched to the on state and a predetermined time elapses.

9. The system of claim 1, wherein the control unit receives the second voltage measured by the second voltage measurement unit when the first main relay is switched to an on state and the precharge relay is switched to an off state while the first main relay is in an off state and the second main relay and the precharge relay are in an on state, and determines that the first main relay is in an inoperative state when the second voltage is smaller than a reference voltage.

10. The system of claim 1, wherein the control unit receives the second voltage measured by the second voltage measurement unit when the second main relay is switched to an off state while the first main relay and the second main relay are in an on state and the precharge relay is in an off state, and determines that the second main relay is in a fused state when the second voltage is greater than or equal to a reference voltage.

11. The system of claim 1, wherein the control unit receives the first voltage measured by the first voltage measurement unit when the first main relay is switched to an off state while the first main relay is in an on state and the second main relay and the precharge relay are in an off state, and determines that the first main relay or the precharge relay is in a fused state when the first voltage is greater than or equal to a reference voltage.

12. The system of claim 1, wherein the control unit receives the third voltage measured by the third voltage measurement unit when the first main relay and the second main relay are switched to an off state while the first main relay and the second main relay are in an on state and the precharge relay is in an off state, and determines that the second main relay is in a fused state when the third voltage is greater than or equal to a reference voltage.

* * * * *